United States Patent [19]

Hamilton

[11] Patent Number: 5,408,567
[45] Date of Patent: Apr. 18, 1995

[54] ELECTRONIC CIRCUIT ASSEMBLY WITH OPTICAL WAVEGUIDE FOR INTERCONNECTING ELECTRONIC COMPONENTS

[75] Inventor: Phillip G. B. Hamilton, Congleton, England

[73] Assignee: International Computers Limited, London, England

[21] Appl. No.: 161,050

[22] Filed: Dec. 1, 1993

[30] Foreign Application Priority Data

Dec. 3, 1992 [GB] United Kingdom ............... 9225274

[51] Int. Cl.⁶ ..................... G02B 6/00; G02B 6/36
[52] U.S. Cl. .......................... 385/132; 385/129
[58] Field of Search ............................. 385/129–132

[56] References Cited

U.S. PATENT DOCUMENTS

| | | | |
|---|---|---|---|
| 4,585,299 | 4/1986 | Strain | 385/132 |
| 4,762,382 | 8/1988 | Husain et al. | 385/132 |
| 4,799,749 | 1/1989 | Borner et al. | 385/132 X |
| 4,830,447 | 5/1989 | Kamiyama et al. | 385/129 X |
| 4,834,480 | 5/1989 | Baker et al. | 385/132 |
| 4,893,162 | 1/1990 | Gentner et al. | 385/132 X |
| 5,051,029 | 10/1991 | Ishikawa | 385/132 |

Primary Examiner—Akm E. Ullah
Attorney, Agent, or Firm—Lee, Mann, Smith, McWilliams, Sweeney & Ohlson

[57] ABSTRACT

A method of forming an electronic circuit assembly in which channels are formed in a surface of a circuit board e.g. by excimer laser drilling, and then filled with an optically transmissive resin material, to form an optical waveguide structure. A number of electronic devices are mounted on the circuit board, at least some of the devices including optical receiver and/or transmitter means for receiving/transmitting optical signals from/to the waveguide. An optical fibre is coupled to the waveguide.

5 Claims, 1 Drawing Sheet

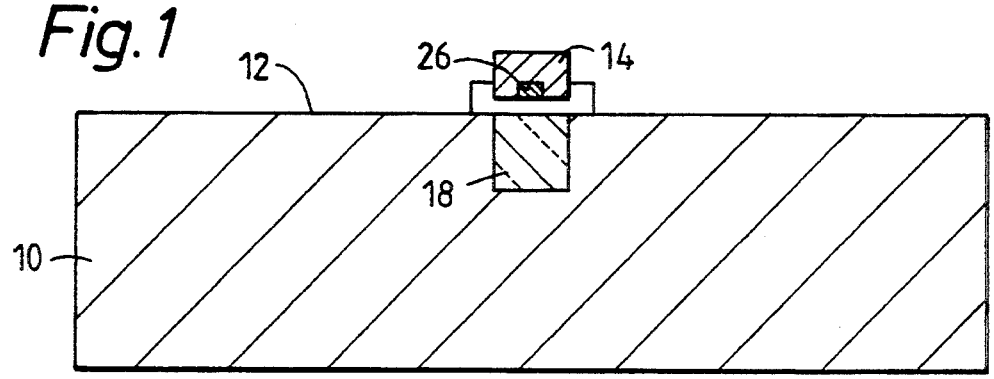
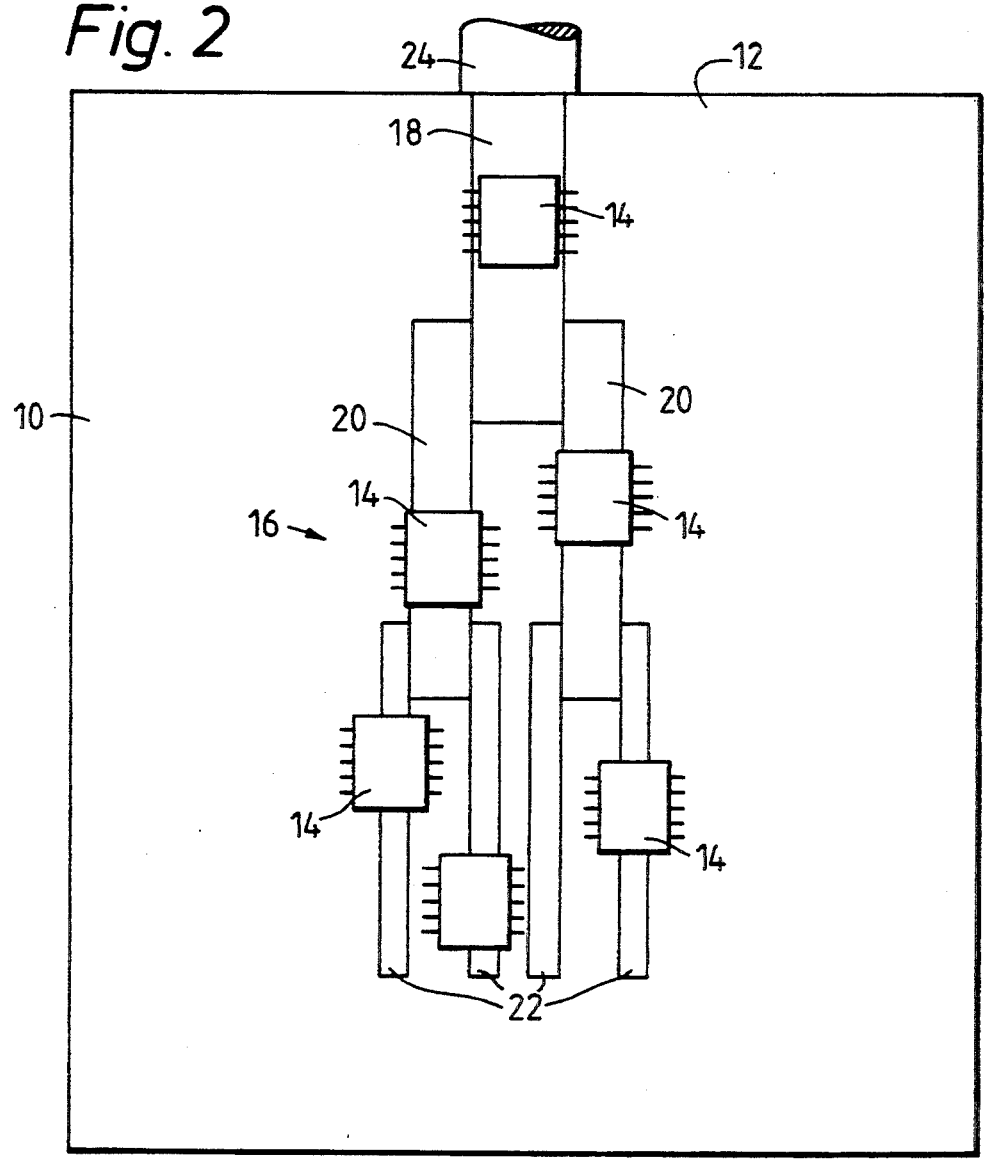

ELECTRONIC CIRCUIT ASSEMBLY WITH OPTICAL WAVEGUIDE FOR INTERCONNECTING ELECTRONIC COMPONENTS

BACKGROUND TO THE INVENTION

This invention relates to electronic circuit assemblies.

It is well known to transmit data signals by way of optical fibres. Optical transmission has the advantage of high bandwidth and high clock rates, while providing electrical isolation between transmitter and receiver.

Conventionally, when optical data is received by a circuit assembly, it is converted into electrical signals, and these electrical signals are then routed by way of printed circuit tracks to individual devices (chips) in the assembly. Because the clock rate of the optical data is very high, it is usually necessary to provide a serial/parallel conversion, to reduce the clock rate of the electrical signals.

The object of the invention is to provide an improved electronic circuit assembly in which optical signals are handled in a novel and more efficient manner.

SUMMARY OF THE INVENTION

According to the invention there is provided a method of constructing an electronic circuit assembly comprising:

(a) forming channels in a surface of a circuit board, (b) filling the channels with an optically transmissive resin material, to form an optical waveguide structure, (c) mounting a plurality of electronic devices on the circuit board, at least some of the devices including optical receiver and/or transmitter means for receiving/transmitting optical signals from/to the waveguide, and (d) coupling an optical fibre to the waveguide.

Thus, it can be seen that the invention provides, in effect, an optical waveguide within the circuit board which allows the input signals to remain in optical form up to the individual devices on the board, avoiding the necessity for transmitting data over printed circuit tracks on the board, and avoiding the need for serial/parallel conversion.

BRIEF DESCRIPTION OF THE DRAWINGS

FIGS. 1 and 2 are a view of a circuit assembly in accordance with the invention.

DESCRIPTION OF AN EMBODIMENT OF THE INVENTION

One electronic circuit assembly in accordance with the invention will now be described by way of example with reference to the accompanying drawing.

The assembly comprises a multi-layer printed circuit board 10 having a top surface 12 on which a number of components (chips) 14 are mounted. The chips have pins which are electrically connected to conductive tracks within the circuit board, in the conventional manner.

The board 10 contains an optical waveguide structure 16 which extends adjacent to the top surface 12. The waveguide structure is generally tree-shaped, having a main trunk 18, two first-level branches 20, and four second-level branches 22. The layers of the board in which the waveguide structure is located are constructed from glass-free (eg paper-based) resin material. The other layers may be conventional glass reinforced layers.

An optical fibre 24 carries input optical signals to the assembly. The end of the fibre 24 and the base of the waveguide structure 16 are both polished flat and are held in abutment with each other by clamps (not shown). Thus, optical signals received along the fibre 24 can pass into the waveguide structure and are propagated through this waveguide to the chips 14.

Each of the chips 14 that requires to receive data from the waveguide includes a photodiode, which receives the optical signals from its adjacent portion of the waveguide and converts these to electrical signals for processing by the circuits within the chip.

The waveguide structure is preferably formed as follows.

First, a copper pattern is formed on the top surface 12 of the board, by conventional masking/etching techniques. The copper pattern defines a mask frame around the shape of the waveguide. An excimer laser is then used to cut a channel into the top surface 12 of the board, within this mask frame, in the required shape of the waveguide. This channel is then filled with liquid resin. The resin is chosen to be of a type which, when cured, is optically transmissive.

The board is then placed in an airtight plastic bag, which is then evacuated. This is then placed in an autoclave and then heated, under pressure, to cure the resin. This autoclave process ensures that the resin is forced fully into the channel. The branch is then removed from the bag and the components are mounted on it in the normal way.

The waveguide 16 may also serve to transmit optical data from the chips 14 back to the optical fibre 24. In this case, at least some of the chips 14 would contain laser diodes for generating output optical signals.

The optical data may include two or more separate data streams at different optical wavelengths ie the data may be wavelength-division multiplexed. In this case, the photodiode in each receiving chip may be tuned to one particular wavelength, so that it can filter out a selected data stream. Similarly, different chips may include laser diodes tuned to different wavelengths, so as to multiplex the output signals.

In an alternative embodiment of the invention, the different parts of the waveguide structure (namely the main trunk 18, and the branches 20, 22) may be formed of resins of different refractive index. By suitable choice of resins, the waveguide can be made to act as a filter, allowing only selected ranges of frequencies to propagate from the main trunk 18 into each of the first-level branches, and only a sub-range of those selected ranges to propagate from the first-level branches into the second level branches. Thus, in this case, wavelength demultiplexing is performed by the waveguide structure itself.

This alternative form of waveguide structure can be constructed by a similar process to that described above, except that each portion of the structure must be formed separately. For example, the main trunk portion 18 may be formed first, by cutting, filling and curing, then the first-level branches 20, and finally the second-level branches.

In another alternative embodiment of the invention, further printed circuit layers may be added on top of the waveguide structure, so that the waveguide structure is sandwiched between two sets of printed circuit layers.

In this case, it is necessary to cut holes in these further printed circuit layers to allow light to pass between the waveguide and the chips.

I claim:

1. A method of forming an electronic circuit assembly comprising:
   (a) forming channels in a surface of a circuit board,
   (b) filling the channels with an optically transmissive resin material, to form an optical waveguide structure,
   (c) mounting a plurality of electronic devices on said surface of the circuit board adjacent to said waveguide structure, at least some of the devices including optical receiver and transmitter means, and optically coupling said optical receiver and transmitter means to said waveguide structure, and
   (d) optically coupling an optical fibre to said waveguide structure.

2. A method according to claim 1 wherein said channels are formed by excimer laser drilling.

3. An electronic circuit comprising
   (a) a circuit board having a plurality of channels formed in a surface of said circuit board, the channels being filled with an optically transmissive resin material, to form an optical waveguide structure,
   (b) a plurality of electronic devices mounted on said surface of the circuit board adjacent to said waveguide structure, at least some of the devices including optical receiver and transmitter means optically coupled to said waveguide structure, for receiving and transmitting optical signals from and to said waveguide structure, and
   (c) an optical fibre optically coupled to said waveguide structure.

4. A method according to claim 1 wherein different portions of said channels are filled with optically transmissive resin materials of different refractive indexes.

5. An electronic circuit assembly according to claim 3 wherein said waveguide structure comprises a plurality of portions, said portions being of different refractive indexes.

* * * * *